(12) United States Patent
Trotman et al.

(10) Patent No.: US 12,075,587 B2
(45) Date of Patent: Aug. 27, 2024

(54) HEAT TRANSFER INTERFACES FOR CIRCUIT CARD ASSEMBLY (CCA) MODULES

(71) Applicant: Hamilton Sundstrand Corporation, Charlotte, NC (US)

(72) Inventors: Alexander Trotman, South Windsor, CT (US); Josh Kamp, Glastonbury, CT (US); Judy Schwartz, Longmeadow, MA (US); Robert DeFelice, South Windsor, CT (US); Michael Doe, Jr., Southwick, MA (US); Anthony Matthew DeLugan, Westfield, MA (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 228 days.

(21) Appl. No.: 17/673,992

(22) Filed: Feb. 17, 2022

(65) Prior Publication Data
US 2023/0262917 A1 Aug. 17, 2023

(51) Int. Cl.
*H05K 7/14* (2006.01)
*H05K 7/20* (2006.01)

(52) U.S. Cl.
CPC ......... *H05K 7/1404* (2013.01); *H05K 7/2039* (2013.01); *H05K 7/20545* (2013.01)

(58) Field of Classification Search
None
See application file for complete search history.

(56) References Cited

U.S. PATENT DOCUMENTS

| | | | | |
|---|---|---|---|---|
| 4,867,235 A | * | 9/1989 | Grapes | H05K 1/056 165/185 |
| 5,255,738 A | * | 10/1993 | Przilas | H05K 7/205 165/905 |
| 6,141,211 A | * | 10/2000 | Strickler | G06F 1/20 361/679.49 |
| 6,246,582 B1 | | 6/2001 | Habing et al. | |
| 6,665,184 B2 | | 12/2003 | Akselband | |
| 7,180,737 B2 | * | 2/2007 | Straub, Jr. | H05K 7/20563 165/122 |
| 7,483,271 B2 | | 1/2009 | Miller et al. | |

(Continued)

FOREIGN PATENT DOCUMENTS

| | | |
|---|---|---|
| CN | 108430188 B | 3/2020 |
| WO | 2009149640 A1 | 12/2009 |
| WO | 2011053313 A1 | 5/2011 |

OTHER PUBLICATIONS

Extended European Search Report dated Jun. 29, 2023, issued during the prosecution of European Patent Application No. EP 23157066.4.

*Primary Examiner* — Courtney L Smith
(74) *Attorney, Agent, or Firm* — Kinney & Lange, P.A.

(57) ABSTRACT

An electronic module assembly includes a circuit card assembly (CCA) including heat generating electronic components. A connector is electrically connected to the heat generating electronic components. The connector is positioned at a connection end of the CCA. A heatsink is mounted to the CCA and is connected in thermal communication with the electronic components. A wedge feature is defined along a lateral edge of the heatsink relative to the connector.

13 Claims, 3 Drawing Sheets

(56) References Cited

U.S. PATENT DOCUMENTS

| | | | |
|---|---|---|---|
| 8,223,497 B2* | 7/2012 | Sundstrom | H05K 7/20536 |
| | | | 361/720 |
| 8,477,498 B2* | 7/2013 | Porreca | H05K 7/1404 |
| | | | 361/708 |
| 8,570,744 B2* | 10/2013 | Rau | H01L 23/473 |
| | | | 361/720 |
| 8,787,015 B2* | 7/2014 | El-Essawy | G06F 1/20 |
| | | | 165/104.34 |
| 9,357,670 B2 | 5/2016 | Stutzman et al. | |
| 9,414,524 B2* | 8/2016 | Zemke | H05K 7/1404 |
| 10,034,403 B1 | 7/2018 | Flannery et al. | |
| 2007/0042514 A1* | 2/2007 | Wu | H05K 7/20727 |
| | | | 361/688 |
| 2008/0130219 A1* | 6/2008 | Rabinovitz | G11B 33/1426 |
| | | | 361/679.31 |
| 2012/0063084 A1* | 3/2012 | Fowler | H05K 7/1439 |
| | | | 361/699 |
| 2014/0133093 A1 | 5/2014 | Cox et al. | |
| 2015/0230365 A1 | 8/2015 | Kaplun et al. | |
| 2021/0109574 A1 | 4/2021 | Franz et al. | |
| 2021/0274678 A1* | 9/2021 | Nozuki | H05K 7/209 |

* cited by examiner

HEAT TRANSFER INTERFACES FOR CIRCUIT CARD ASSEMBLY (CCA) MODULES

BACKGROUND

1. Field

The present disclosure relates to heat transfer in electronic devices, and more particularly to heat transfer interfaces for circuit card assemblies (CCAs).

2. Description of Related Art

As the electronics industry pushes towards modularity, replaceable card-guide CCA (circuit card assembly) designs are becoming increasingly common. With this modularity comes the need for modules to be quickly installed and removed. Traditional methods of CCA retention (e.g. wedge locks) in modular designs provide very little resultant surface area for heat transfer once tightened in place. This provides challenges for thermal management as demand for the power dissipation of CCA designs is growing.

The conventional techniques have been considered satisfactory for their intended purpose. However, there is an ever present need for improved systems and methods for improved heat transfer from CCAs. This disclosure provides a solution for this need.

SUMMARY

An electronic module assembly includes a circuit card assembly (CCA) including heat generating electronic components. A connector is electrically connected to the heat generating electronic components. The connector is positioned at a connection end of the CCA. A heatsink is mounted to the CCA and is connected in thermal communication with the electronic components. A wedge feature is defined along a lateral edge of the heatsink relative to the connector.

The wedge feature can wedge down in a direction from a top edge of the CCA opposite the connection end toward the connector. The wedge feature can extend along the full length of the lateral edge of the heatsink. The wedge feature can be defined between two wedge surfaces, wherein each wedge surface is oblique relative to an insertion axis defined by the connector. The wedge feature can be defined between two wedge surfaces, wherein each wedge surface is oblique relative to a plane defined by the CCA. At least one additional connector can be aligned with the first connector for connecting independent functions of the CCA to an electrical interface of a chassis.

The assembly can include a chassis. A rail feature can be defined on an inward facing surface of the chassis. The connector can be connected to a corresponding electrical interface in the chassis with the wedge feature engaged with the rail feature to house the CCA and heatsink within the chassis. Opposed wedge surfaces of the wedge feature can be engaged in thermal contact in their entirety with corresponding surfaces of the rail feature for sinking heat from the heat generating electronic components to the chassis. The wedge feature and rail feature can be configured to guide the connector to connect with the electrical interface of the chassis as the CCA is inserted into the chassis. The connector, electrical interface, wedge feature, and rail feature can be configured to retain the CCA in place within the chassis.

The heatsink can include a second wedge feature defined along a lateral edge of the heatsink opposite the first wedge feature, wherein the chassis includes a second rail feature defined on an inward facing surface of the chassis opposite the first rail feature. The second wedge feature can be engaged with the second rail feature.

The CCA can occupy a first bay of the chassis, wherein the chassis includes a second bay with wedge locks configured for retaining a wedge locking CCA in the chassis. The CCA can occupy a first bay of the chassis, wherein the chassis includes a second bay with a second rail feature configured for retaining a second CCA with a corresponding wedge feature. The CCA can occupy a bay of the chassis that is configured to receive CCA modules complying with one of 3U, 6U, 9U, and VITA-compliant module envelopes.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
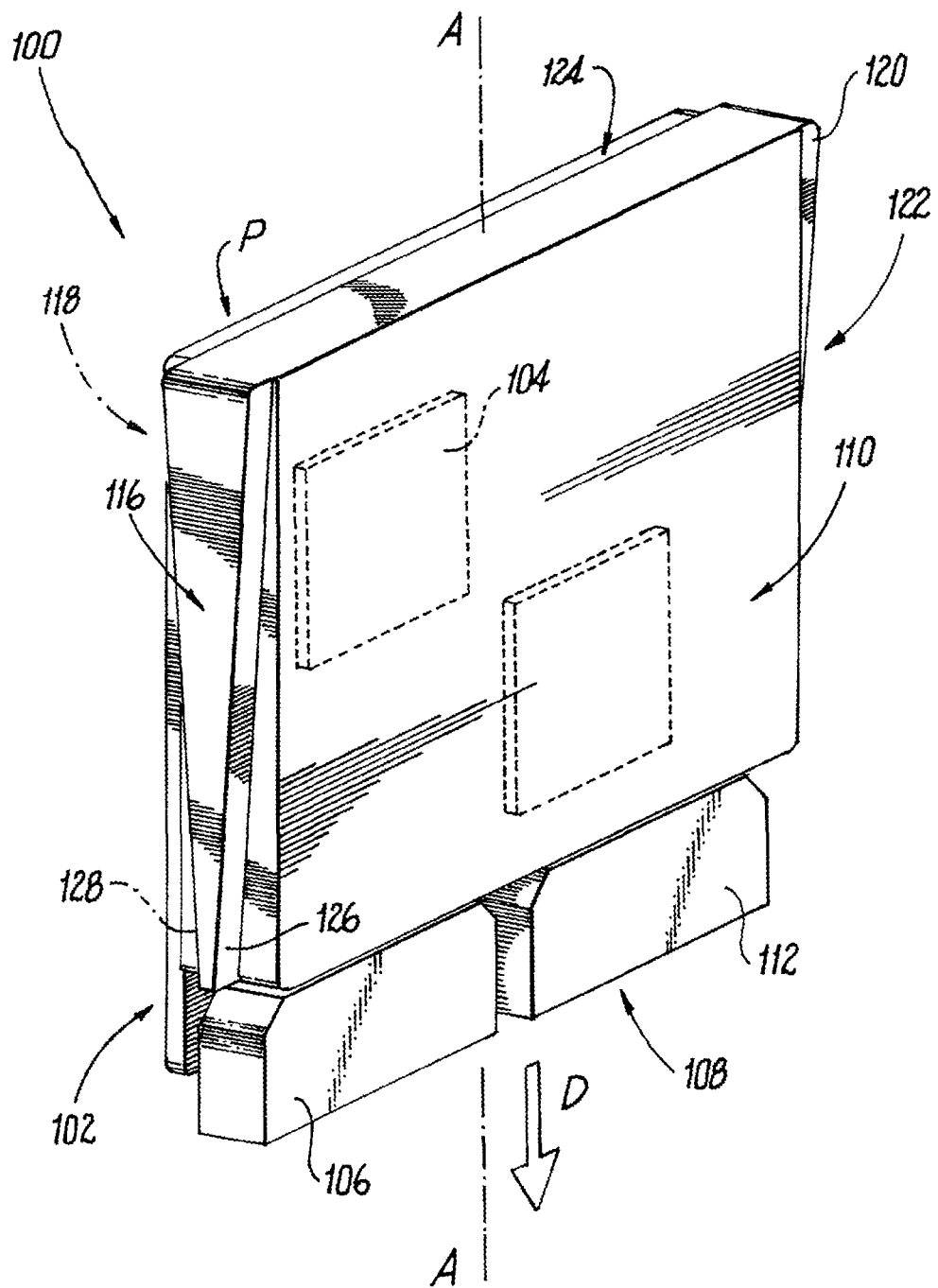
FIG. 1 is a schematic perspective view of an embodiment of an assembly constructed in accordance with the present disclosure, showing the circuit card assembly (CCA), connectors, and heatsink with wedge features.

Reference will now be made to the drawings wherein like reference numerals identify similar structural features or aspects of the subject disclosure. For purposes of explanation and illustration, and not limitation, a partial view of an embodiment of an electronic module assembly in accordance with the disclosure is shown in FIG. 1 and is designated generally by reference character 100. Other embodiments of systems in accordance with the disclosure, or aspects thereof, are provided in FIGS. 2-3, as will be described. The systems and methods described herein can be used to improve heat sinking from heat generating components of circuit card assemblies (CCAs) relative to conventional wedge locks.

The electronic module assembly 100 includes a circuit card assembly (CCA) 102 including heat generating electronic components 104. A first connector 106 is electrically connected to the heat generating electronic components 104. The connector is positioned at a connection end 108 of the CCA 102. A heatsink 110 is mounted to the CCA 102 and is connected in thermal communication with the electronic components 104. At least one additional connector 112 is aligned with the first connector 106, e.g., for connecting independent functions or modules of the CCA 102 to an electrical interface 138 of a chassis 114, which shown and described below with reference to FIG. 2-3. Those skilled in the art will readily appreciate that any suitable number of connectors 108, 112 can be used, including one, without departing from the scope of this disclosure.

With continued reference to FIG. 1, a wedge feature 116 is defined along a lateral edge 118 of the heatsink relative to the connector. The heatsink 110 includes a second wedge 120 feature defined along the opposite lateral edge 122 of the heatsink opposite the first wedge feature 116. Each wedge feature 116, 120 wedges down in a direction D from a top edge 124 (as oriented in FIG. 1) of the CCA 102 opposite the connection end 108 toward the connectors 106, 112. Each wedge 116, 120 extends along the full length of its respective lateral edge 118, 122 of the heatsink 110, although it can also extend less than the full length without departing from the scope of this disclosure. Each wedge feature 116, 120 is defined between two wedge surfaces 126, 128 (only labeled in FIG. 1 for wedge feature 116, however they are similar for wedge feature 120). Each wedge surface 126, 128 is oblique relative to an insertion axis A defined by the connectors 106, 112. Each wedge surface 126, 128 is also oblique relative to the plane P defined by the CCA 102.

Figure 2:
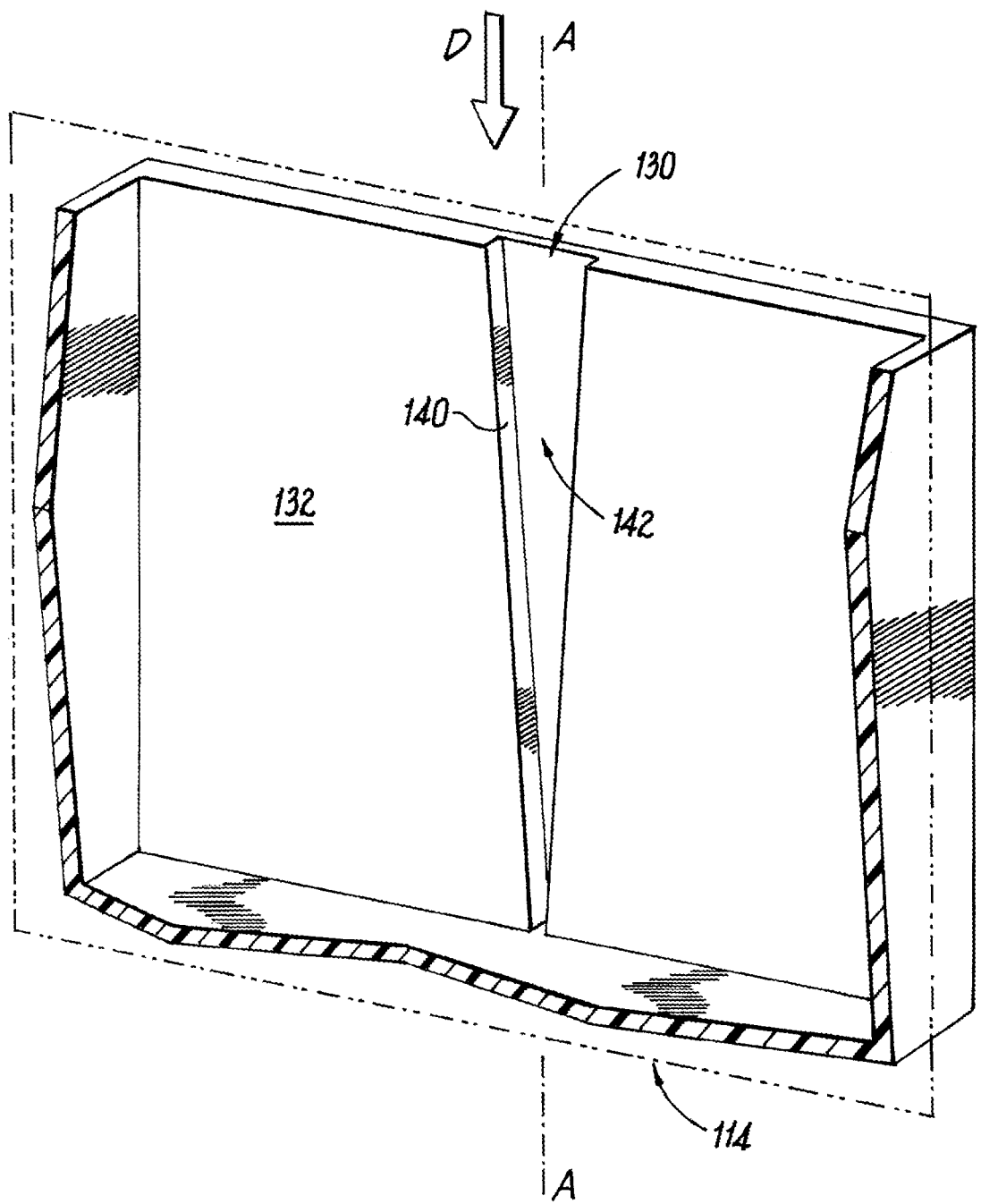
FIG. 2 is a perspective view of a portion of a chassis for an assembly of FIG. 1, showing the rail features in an internal surface of the chassis.
Figure 3:
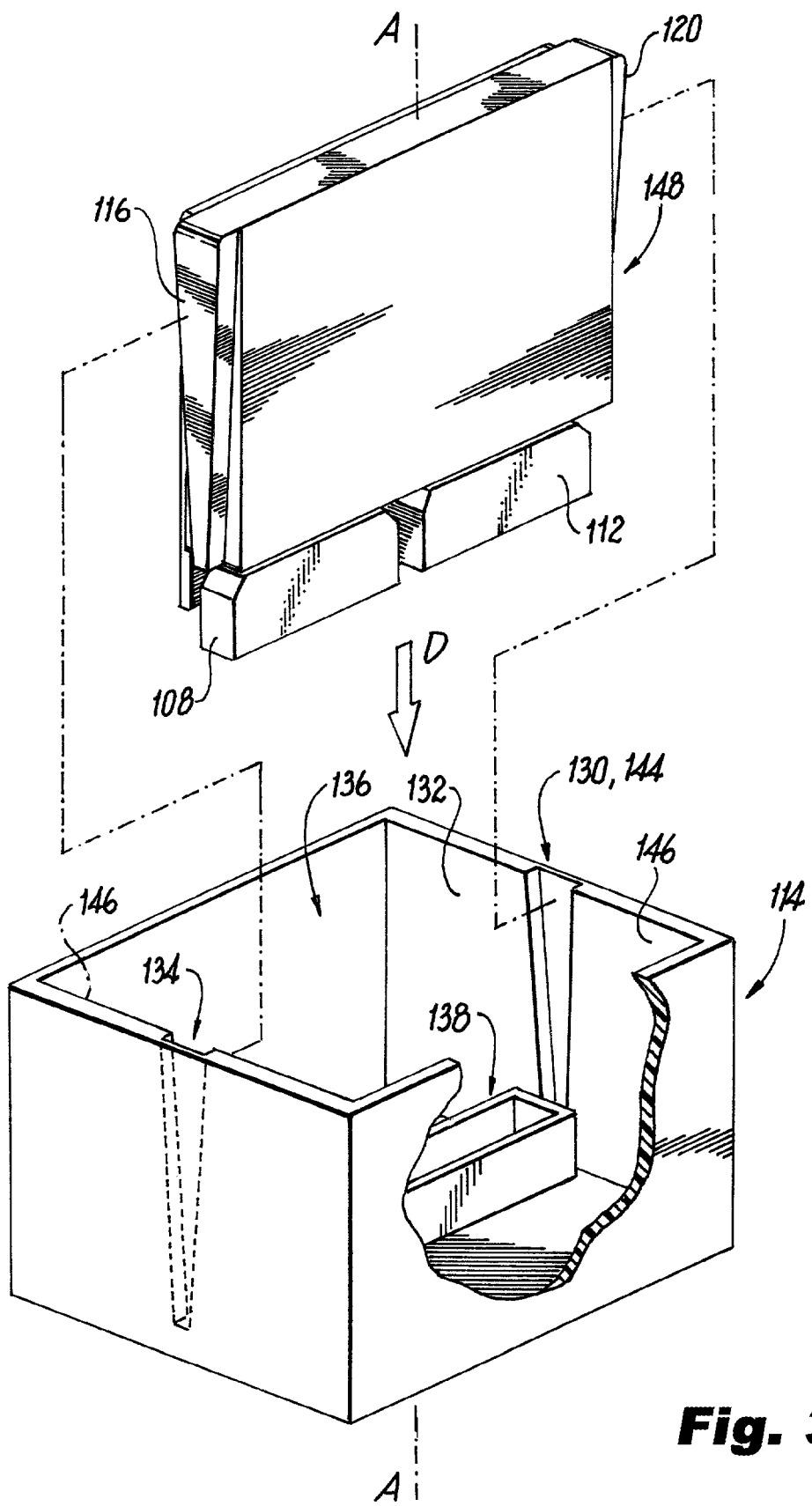
FIG. 3 is an exploded perspective view of the assembly of FIG. 1, showing the card or module with the CCA, connectors, and heatsink being inserted into the chassis.

The assembly 100 can include a chassis 114, a portion of which is shown in FIG. 2. A rail feature 130 is defined on an inward facing surface 132 of the chassis 114. Referring to FIG. 3, a second rail feature 134 mirroring the first rail feature 130 is defined in the inward facing surface 136 of the chassis 114 opposite from the first rail 130.

With continued reference to FIG. 3, the connectors 108, 112 can be connected to a corresponding electrical interface 138 in the chassis 114 by inserting the CCA/heat sink module 102/110 into the chassis 114 in the direction D along the insertion axis A. In doing so, the wedge features 116, 120 are engaged with the respective rail features 134, 130 to house the CCA 102 and heatsink 110 within the chassis 114. Opposed wedge surfaces 126, 128 (labeled in FIG. 1) of the wedge features 116, 120 are engaged in thermal contact in their entirety with corresponding surfaces 140, 142 (labeled in FIG. 2) of the rail features 130, 134 for sinking heat from the heat generating electronic components 104 (labeled in FIG. 1), through the heat sink and into the chassis 114. The wedge features 116, 120 and rail features 130, 134 are configured to guide the connectors 108, 112 to connect with the electrical interface 138 of the chassis 115 as the CCA 102 is inserted into the chassis 114. The connectors 108, 112, electrical interface 138, wedge features 116, 120, and rail features 130, 134 are configured to retain the card or assembly 148 of the CCA 102 in place within the chassis 114 without any other locking features, e.g. there are no traditional wedge locks required.

The CCA 102 occupies a first bay 144 of the chassis 114. The chassis can includes any suitable number of additional bays, e.g. at the positions indicated by reference characters 146 in FIG. 3, which can include traditional wedge locks configured for retaining a wedge locking CCAs in the chassis 114, and/or a second set of rail features as disclosed herein configured for retaining a second CCA 102 with corresponding wedge features 116, 120. The module or card 148 of the CCA 102, heat sink 110, and connectors 108, 112 can be configured to comply with the module envelope specifications for 3U, 6U, 9U, VITA, or any other suitable envelope. The bays 144, 146 of the chassis 114 can correspondingly be configured to receive CCA's complying with 3U, 6U, 9U, or VITA, or any other suitable envelope specifications.

Systems and methods as disclosed herein can provide potential benefits such as the following. In terms of technical performance relative to traditional systems, they can provide increased contact surface area at module/rail interface for improved thermal management. They can provide structural retention between module and rail without the use of additional components. Systems as disclosed herein can be applied across multiple adjacent modules in a single end assembly. In terms of cost and complexity, systems and methods as disclosed herein can reduce/eliminate wedge-lock use and associated mounting hardware. They can also be applied as part of the normal machining/printing process of the heatsink and end assembly components, e.g. the wedge features and rail features can be machined or printed into the heat sink 110 and chassis 114.

The methods and systems of the present disclosure, as described above and shown in the drawings, provide for improved heat sinking from heat generating components of circuit card assemblies (CCAs) relative to conventional wedge locks. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An electronic module assembly comprising:
a circuit card assembly (CCA) including heat generating electronic components;
a connector electrically connected to the heat generating electronic components, wherein the connector is positioned at a connection end of the CCA; and
a heatsink mounted to the CCA and connected in thermal communication with the electronic components, wherein a wedge feature is defined along a lateral edge of the heatsink relative to the connector, wherein the wedge feature wedges down in a direction from a top edge of the CCA toward the connector, wherein the wedge feature is defined between two wedge surfaces, wherein each wedge surface is oblique relative to an insertion axis defined by the connector.

2. The assembly as recited in claim 1, wherein the wedge feature is a first wedge feature, wherein the heatsink includes a second wedge feature defined along a lateral edge of the heatsink opposite the first wedge feature.

3. The assembly as recited in claim 1, wherein the wedge extends along the full length of the lateral edge of the heatsink.

4. The assembly as recited in claim 1 wherein the wedge feature is defined between two wedge surfaces, wherein each wedge surface is oblique relative to a plane defined by the CCA.

5. The assembly as recited in claim 1, further comprising a chassis, wherein a rail feature is defined on an inward facing surface of the chassis, and wherein the connector is connected to a corresponding electrical interface in the chassis with the wedge feature engaged with the rail feature to house the CCA and heatsink within the chassis.

6. The assembly as recited in claim 5, wherein opposed wedge surfaces of the wedge feature are engaged in thermal contact in their entirety with corresponding surfaces of the rail feature for sinking heat from the heat generating electronic components to the chassis.

7. The assembly as recited in claim 6, wherein the wedge feature and rail feature are configured to guide the connector to connect with the electrical interface of the chassis as the CCA is inserted into the chassis.

8. The assembly as recited in claim 7, wherein the connector, electrical interface, wedge feature, and rail feature are configured to retain the CCA in place within the chassis.

9. The assembly as recited in claim 5, wherein the CCA occupies a first bay of the chassis, wherein the chassis includes a second bay with wedge locks configured for retaining a wedge locking CCA in the chassis.

10. The assembly as recited in claim 5, wherein the CCA occupies a first bay of the chassis, wherein the chassis includes a second bay with a second rail feature configured for retaining a second CCA with a corresponding wedge feature.

11. The assembly as recited in claim 5, wherein the CCA occupies a bay of the chassis that is configured to receive CCA modules complying with one of 3U, 6U, 9U, and VITA-compliant module envelopes.

12. The assembly as recited in claim 5, wherein the wedge feature is a first wedge feature and the rail feature is a first rail feature, wherein the heatsink includes a second wedge feature defined along a lateral edge of the heatsink opposite the first wedge feature, wherein the chassis includes a second rail feature defined on an inward facing surface of the chassis opposite the first rail feature, and wherein the second wedge feature is engaged with the second rail feature.

13. The assembly as recited in claim 1, wherein the connector is a first connector and further comprising at least one additional connector aligned with the first connector for connecting independent functions of the CCA to an electrical interface of a chassis.

* * * * *